(12) United States Patent
Ghoshal (10) Patent No.: US 6,598,403 B1
(45) Date of Patent: Jul. 29, 2003

(54) NANOSCOPIC THERMOELECTRIC REFRIGERATORS (75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/121,497

(22) Filed: Apr. 11, 2002

(51) Int. Cl.[7] ................................................. F25B 21/02
(52) U.S. Cl. ................... 62/3.2; 62/3.3; 62/3.6; 62/3.7; 62/3.9
(58) Field of Search ........................... 62/3.2, 3.3, 3.6, 62/3.7, 3.9

(56) References Cited

U.S. PATENT DOCUMENTS

| 3,635,037 | A | * | 1/1972 | Hubert | 62/3 |
| 3,726,100 | A | * | 4/1973 | Widakowich | 62/3 |
| 4,730,459 | A | * | 3/1988 | Schlicklin et al. | 62/3 |
| 5,712,448 | A | * | 1/1998 | Vandersande et al. | 136/203 |
| 5,724,818 | A | * | 3/1998 | Iwata et al. | 62/3.7 |
| 6,000,225 | A | | 12/1999 | Ghoshal | 62/3.7 |
| 6,256,996 | B1 | | 7/2001 | Ghoshal | 62/3.7 |
| 6,347,521 | B1 | * | 2/2002 | Kadotani et al. | 62/3.7 |
| 6,467,275 | B1 | * | 10/2002 | Ghoshal | 62/3.3 |

OTHER PUBLICATIONS

Gudiksen et al., "Growth of Nanowire Superlattice Structures for Nanoscale Photonics and Electronics", Feb. 11, 2002, pp. 1–7, http://www.nature.com/cgi-taf/DynaPage.taf?file=.../415617a_r.html&filetype=&dynoptions.

* cited by examiner

Primary Examiner—William C. Doerrler
Assistant Examiner—Mark Shulman
(74) Attorney, Agent, or Firm—Duke W. Yee; Casimer K. Salys; Patrick C. R. Holmes (57) ABSTRACT

A thermoelectric cooling system integrating quantum cold point connections with lateral thermoelectric element formation. A preferred system has an n-type and p-type thermoelectric element, each connected to a common conducting section. The thermoelectric elements are each tapered at the end where they contact the common conducting section. The thermoelectric elements preferably all occupy substantially the same plane as each other and as the common conducting section.

27 Claims, 5 Drawing Sheets

NANOSCOPIC THERMOELECTRIC REFRIGERATORS

BACKGROUND OF THE INVENTION

1. Technical Field

The present innovations relate to cooling technology, and more particularly to thermoelectric coolers implementing the Peltier effect.

2. Description of Related Art

As the speed of computers continues to increase, the amount of heat generated by the circuits within the computers continues to increase. For many circuits and applications, increased heat degrades the performance of the computer. These circuits need to be cooled in order to perform most efficiently. In many low end computers, such as personal computers, the computer may be cooled merely by using a fan and fins for convective cooling. However, for larger computers, such as mainframes, that perform at faster speeds and generate much more heat, these solutions are not viable.

Currently, many mainframes utilize vapor compression coolers to cool the computer. These vapor compression coolers perform essentially the same as the central air conditioning units used in many homes. However, vapor compression coolers are quite mechanically complicated requiring insulation and hoses that must run to various parts of the main frame in order to cool the particular areas that are most susceptible to decreased performance due to overheating.

A much simpler and cheaper type of cooler are thermoelectric coolers. Thermoelectric coolers utilize a physical principle known as the Peltier Effect, by which DC current from a power source is applied across two dissimilar materials causing heat to be absorbed at the junction of the two dissimilar materials. Thus, the heat is removed from a hot substance and may be transported to a heat sink to be dissipated, thereby cooling the hot substance. Thermoelectric coolers may be fabricated within an integrated circuit chip and may cool specific hot spots directly without the need for complicated mechanical systems as is required by vapor compression coolers.

However, current thermoelectric coolers are not as efficient as vapor compression coolers requiring more power to be expended to achieve the same amount of cooling. Furthermore, current thermoelectric coolers are not capable of cooling substances as greatly as vapor compression coolers. Therefore, a thermoelectric cooler with improved efficiency and cooling capacity would be desirable so that complicated vapor compression coolers could be eliminated from small refrigeration applications, such as, for example, main frame computers, thermal management of hot chips, RF communication circuits, magnetic read/write heads, optical and laser devices, and automobile refrigeration systems.

Typical thermoelectric coolers also are formed in a top-down fashion, where the thermoelectric elements are disposed vertically with a cold conducting section (the heat source) on (for example) the bottom of the system, and the hot conducting sections (correspondingly) on the top of the system. Such cooling systems are complicated to fabricate and occupy large volumes.

SUMMARY OF THE INVENTION

The present innovations teach improvements to thermoelectric heating technology. In a preferred embodiment, a thermoelectric cooler system is constructed in the lateral or horizontal direction (as opposed to vertically) having a plurality of pointed tips that serve to contact a thermoelectric material with a conductor. In a preferred embodiment, the thermoelectric elements and the conducting sections to which they connect all substantially occupy the same plane, making the devices smaller than vertically disposed or formed cooling systems. The points on the thermoelectric material are formed preferably using focused ion beam techniques or electron beam lithography. In other preferred embodiments, arrays of such thermoelectric cooling devices are fabricated, to cool nanoscopic regions of various shapes and cooling needs.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
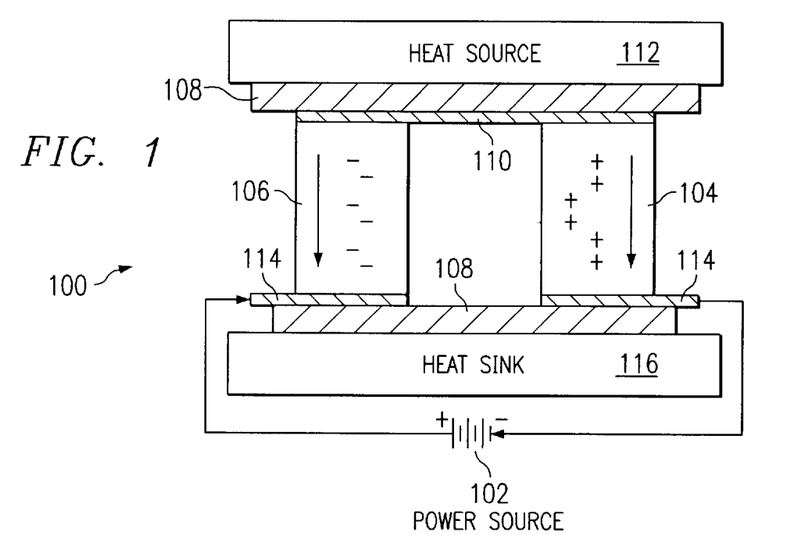
FIG. 1 shows a typical thermoelectric cooling system consistent with the prior art.

With reference now to the figures and, in particular, with reference to FIG. 1, a high-level block diagram of a Thermoelectric Cooling (TEC) device is depicted in accordance with the prior art. Thermoelectric cooling, a well known principle, is based on the Peltier Effect, by which DC current from power source 102 is applied across two dissimilar materials causing heat to be absorbed at the junction of the two dissimilar materials. A typical thermoelectric cooling device utilizes p-type semiconductor 104 and n-type semiconductor 106 sandwiched between poor electrical conductors 108 that have good heat conducting properties. N-type semiconductor 106 has an excess of electrons, while p-type semiconductor 104 has a deficit of electrons.

As electrons move from electrical conductor 110 to n-type semiconductor 106, the energy state of the electrons is raised due to heat energy absorbed from heat source 112. This process has the effect of transferring heat energy from heat source 112 via electron flow through n-type semiconductor 106 and electrical conductor 114 to heat sink 116. The electrons drop to a lower energy state and release the heat energy in electrical conductor 114. It should be noted that a similar and comparable phenomenon occurs with reference to p-type semiconductor material 104.

The coefficient of performance, η, of a cooling refrigerator, such as thermoelectric cooler 100, is the ratio of the cooling capacity of the refrigerator divided by the total power consumption of the refrigerator. Thus the coefficient of performance is given by the equation:

$$\eta = \frac{\alpha I T_c - \frac{1}{2} I^2 R - K \Delta T}{I^2 R + \alpha I \Delta T}$$

where the term $\alpha I T_c$ is due to the thermoelectric cooling, the term $\frac{1}{2}I^2R$ is due to Joule heating backflow, the term $K\Delta T$ is due to thermal conduction, the term $I^2R$ is due to Joule loss, the term $\alpha I \Delta T$ is due to work done against the Peltier voltage, α is the Seebeck coefficient for the material, $T_c$ is the temperature of the heat source, and $\Delta T$ is the difference in the temperature of the heat source from the temperature of the heat sink.

The maximum coefficient of performance is derived by optimizing the current, I, and is given by the following relation:

$$\eta_{max} = \left(\frac{T_c}{\Delta T}\right)\left[\frac{\gamma - \frac{T_h}{T_c}}{\gamma + 1}\right]$$

where $$\gamma = \sqrt{1 + \frac{\alpha^2 \sigma}{\lambda}\left(\frac{T_h + T_c}{2}\right)}$$

and $$\varepsilon = \frac{\gamma - \frac{T_h}{T_c}}{\gamma + 1}$$

where E is the efficiency factor of the refrigerator. The figure of merit, ZT, is given by the equation:

$$ZT = \frac{\alpha^2 \sigma T}{\lambda}$$

where λ is composed of two components: $\lambda_e$, the component due to electrons, and $\lambda_L$, the component due to the lattice. Therefore, the maximum efficiency, ε, is achieved as the figure of merit, ZT, approaches infinity. The efficiency of vapor compressor refrigerators is approximately 0.3. The efficiency of conventional thermoelectric coolers, such as thermoelectric cooler 100 in FIG. 1, is typically less than 0.1. Therefore, to increase the efficiency of thermoelectric coolers to such a range as to compete with vapor compression refrigerators, the figure of merit, ZT, must be increased to greater than 2. If a value for the figure of merit, ZT, of greater than 2 can be achieved, then the thermoelectric coolers may be staged to achieve the same efficiency and cooling capacity as vapor compression refrigerators.

Figure 2A:
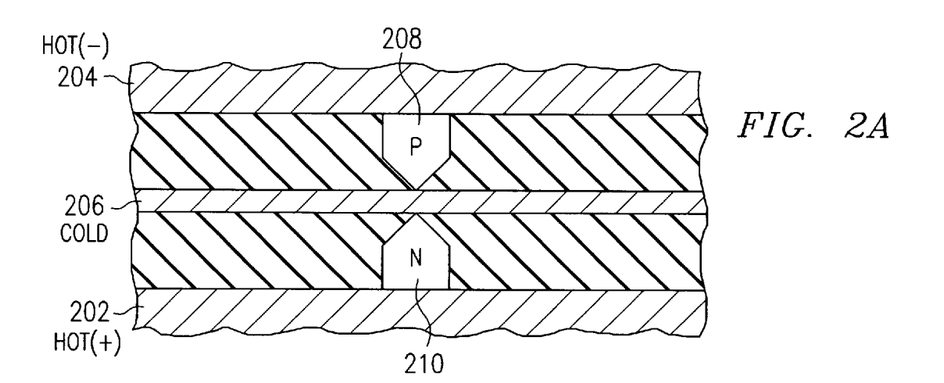
FIG. 2A shows a one dimensional unit cooling cell consistent with a preferred embodiment.

FIG. 2A shows a one dimensional unit cell cooling apparatus, consistent with a preferred embodiment. Two metal contacts 202 204 are shown. These are connected to outside power sources, and provide current through the thermoelectric cell. The cell has a p-type thermoelectric element 208 and an n-type thermoelectric element 210. Between these two elements is another conducting material 206 which serves as the cold part of the cell.

As current passes from hot side 202 to hot side 204 though thermoelectric elements 208 210 the Peltier effect causes cold section 206 to cool and hot sections 202 204 to heat.

Note that thermoelectric elements 208 210 have tapered ends toward cold section 206. This tapered end forms a quantum cold point. The cold points provide electron confinement and also phonon discontinuity, which limits vibrational energy transfer via the lattice of the materials and hence limits heat transfer from thermoelectric elements 208 210 to cold section 206. These effects improve cooling efficiency of the thermoelectric cooling device.

The tapered ends of the p- and n-type thermoelectric elements can be fabricated or formed in a number of ways. For example, the points can be formed by using a focused ion beam to carve away excess material. However, this method is slow and difficult to implement in mass production of devices such as integrated circuits. A more preferred method of forming the tapered ends of the individual elements is to use some kind of lithographic process, preferably electron beam lithography. Electron beam lithography requires masking and etching to create the necessary pointed structures, but this process allows sharper details to be formed and is faster and more easily implemented in a manufacturing context than a focused ion beam. In a preferred embodiment, the n-type thermoelectric elements are made of $Bi_2Te_{2.7}Se_{0.3}$. The p-type thermoelectric elements are preferably made from $Bi_{0.5}Sb_{1.5}Te_3$. Of course these particular materials are not the only possible ones for making the thermoelectric elements within the contemplation of the present innovations.

Figure 2B:
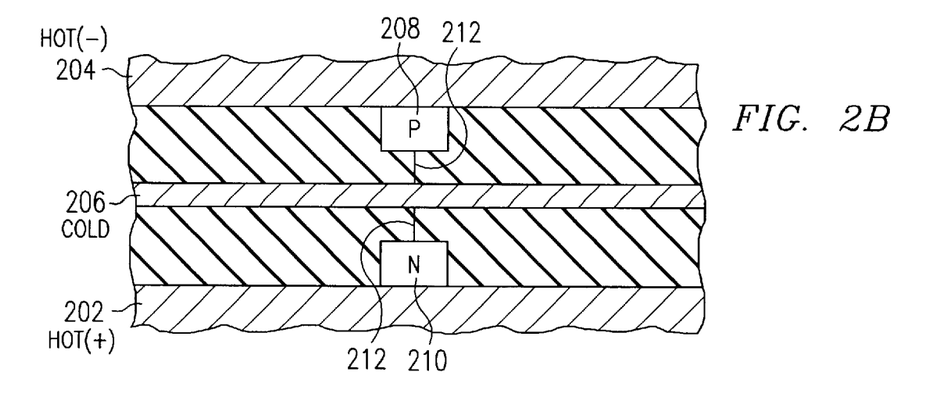
FIG. 2B shows a one dimensional unit cooling cell consistent with a preferred embodiment using nanowires.

FIG. 2B shows another implementation consistent with a preferred embodiment of the present innovations. In this example, the tapered ends of the individual thermoelectric elements 208 210 are replaced by nanowires. Nanowires may be metallic nanotubes or thermoelectric nanowires that exploit one-dimensional electron transport effects, as described in Thermoelectrics: Basic Principles and New Materials Development, by G. Nolas, J. Sharp, and H. Goldsmid (Springer, Berlin, 2001) which is hereby incorporated by reference. However, nanowires are difficult to implement in a mass production context, as they must be placed using such means as an atomic force microscope.

FIG. 3 show a side view of steps in the fabrication process for part of a thermoelectric cooler consistent with a preferred embodiment. This description shows how the preferably two-part thermoelectric cooler is formed. (Preferred embodiments include both an n-type and p-type thermoelectric elements.)

Figure 3A:
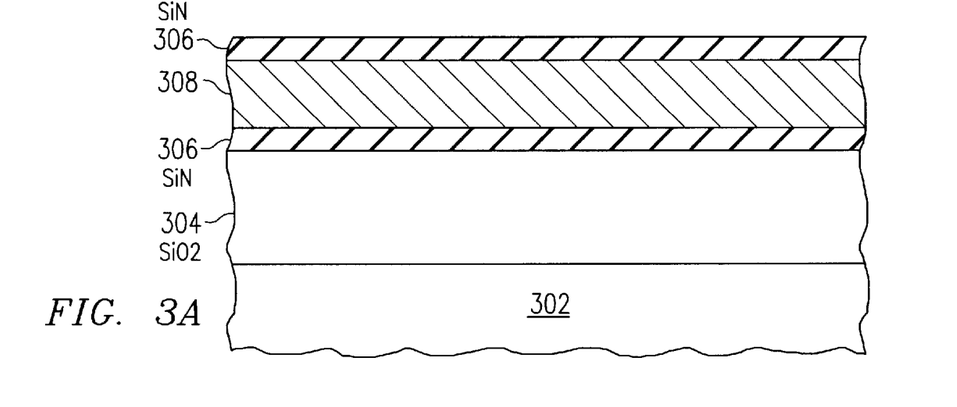
FIGS. 3A–3E show various fabrication steps to forming a thermoelectric cooling system consistent with a preferred embodiment.

FIG. 3A shows a substrate 302 (such as glass) covered by a layer of polyimide or $SiO_2$ 304. Layer 304 is typically hundreds of micrometers thick, and the figures are not to scale. Above layer 304 is formed a layer of SiN 306. This layer serves as an adhesion layer. SiN layer 306 is covered by a layer of metal 308, preferably Cu. This layer is preferably on the order of a few micrometers thick. Metal layer 308 is covered by a second SiN layer 306.

Figure 3B:
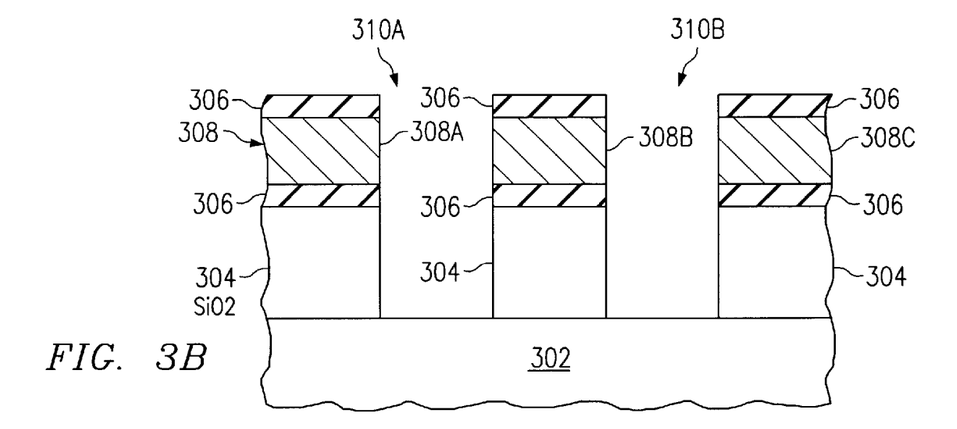

FIG. 3B shows the same region after masked anisotropic etching of the various layers to remove material from regions 310A and 310B. Known methods of masking and etching are preferably used to remove the material down to the surface of substrate 302.

Figure 3C:
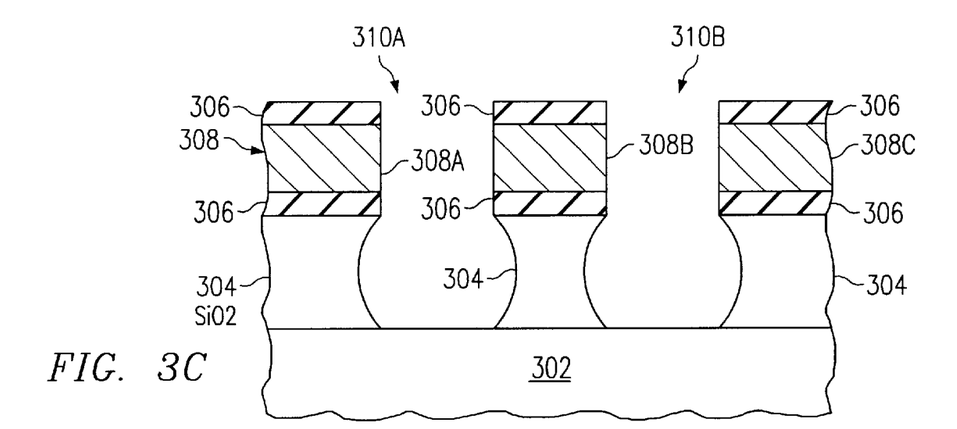

FIG. 3C shows the region after an isotropic etch process has undercut the $SiO_2$ material from the regions of $SiO_2$ layer 304 near the edges of the trenches formed as shown in the figure. These etches further isolate the metal layer shown into three parts, 308A, 308B, 308C.

Figure 3D:
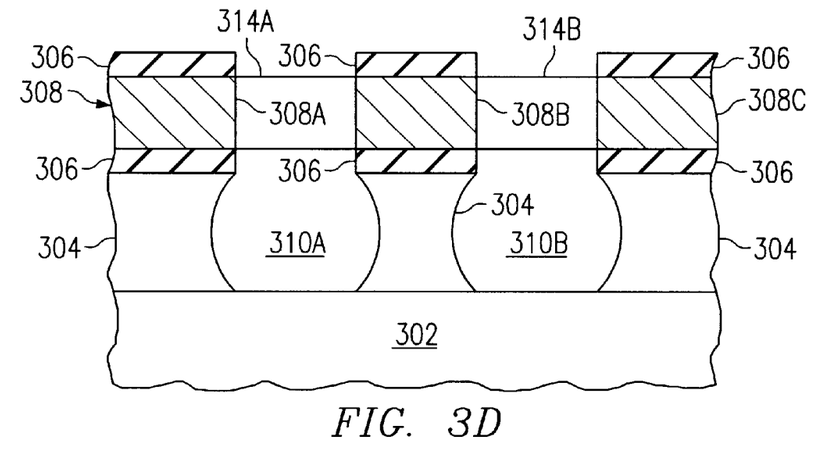

FIG. 3D shows a structure as in FIG. 3C except that two bridges 314A 314B have been formed between the sides of the metal layer 308 between 308A and 308B, and between 308B and 308C. Bridge 314A in this example is formed from an n-type material, and is grown using electroplating techniques. Bridge 314B is formed of a p-type material while masking the n-type material. These n-type and p-type material bridges between the metal sections serves as thermoelectric cooling elements.

Of course the relative positions of the n- and p-type thermoelectric elements can be reversed.

In this embodiment, it will be noted that the thermoelectric elements and the conducting sections to which they connect occupy the same plane, i.e., they are formed in a lateral orientation, and all of them are formed at the same relative height above the substrate 302. Such a lateral configuration is easier to fabricate than a top down structure in forming the points because the shape can be precisely controlled through lithography. The device of the preferred embodiment can be formed as part of a semiconductor processing flow, without the need for mechanical positioning of the points.

In a preferred embodiment, thermoelectric elements 314A 314B are further processed. At the junction where element 314A joins with metal layer 308B, the ends of the element 314A are shaped to a point (see FIG. 4). Likewise, element 314B is shaped to a point where it joins metal layer 308B. This is described further below.

Figure 3E:
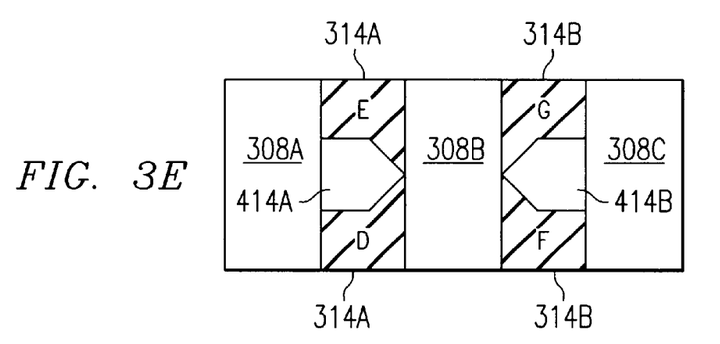

FIG. 3E shows a top view of the innovative structure with pointed sections 414A, 414B. The bridge material (314A, 314B in FIG. 3D) connects sections 308A and 308C each to section 308B, respectively. In FIG. 3E, the shaded sections (labeled D, E, F, G) of 314A and 314B are removed, preferably using focused ion beam etching or photolithographic masking and chemical etching. Removal of these sections leaves the pointed bridges 414A and 414B respectively. Note the narrowed ends of sections 414A and 414B.

Figure 4:
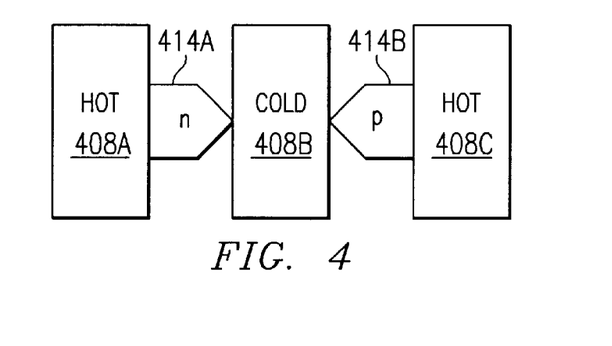
FIG. 4 shows a top view of a thermoelectric cooling system consistent with a preferred embodiment.

FIG. 4 shows a top view of the completed innovative cooling system of FIGS. 3. N-type semiconductor material 414A spans the gap between sections 408A and 408B, while p-type semiconductor 414B spans the gap between sections 408B and 408C. The n- and p-type semiconductors serve as thermoelectric elements.

By making the thermoelectric elements with pointed tips, an increase in cooling efficiency is achieved. Further information on cold point coolers can be found in the following references, which are hereby incorporated by reference: patent applications Ser. No. 09/731,616, entitled "ENHANCED INTERFACE THERMOELECTRIC COOLERS WITH ALL-METAL TIPS;" Ser. No. 09/731,999, entitled "COLD POINT DESIGN FOR EFFICIENT THERMOELECTRIC COOLERS;" Ser. No. 09/731,614, entitled "ENHANCED INTERFACE THERMOELECTRIC COOLERS USING ETCHED THERMOELECTRIC MATERIAL TIPS;" application Ser. No. 09/731,997; U. Ghoshal, S. Ghoshal, C. McDowell, L. Shi, S. Cordes, and M. Farinelli, "ENHANCED THERMOELECTRIC COOLING AT COLD JUNCTION INTERFACES," to appear in the Applied Physics Letters, vol. 80, no. 16, Apr. 22 (2002). The cold points provide electron confinement that increases the Seebeck coefficient and exploits nonequilibrium electron-phonon interaction effects, and also phonon discontinuity, which limits energy transfer via the lattice of the materials and hence limits the heat transfer from thermoelectric elements 208, 210 to cold section 206. These effects improve cooling efficiency of the thermoelectric cooling device.

Figure 5A:
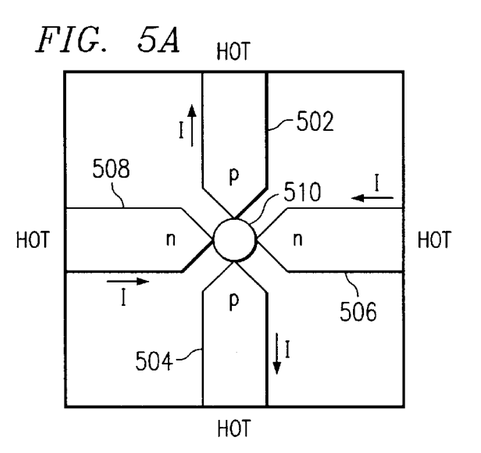
FIG. 5A shows a two-dimensional unit cooling cell consistent with a preferred embodiment.

FIG. 5A shows a top view of a two-dimensional cell implementing another preferred embodiment of the innovative cooling system. The two-dimensional unit cooling cell comprises two p-type thermoelectric elements 502, 504, and two n-type thermoelectric elements 506, 508. All four elements connect to a central island 510, which due to the Peltier effect is cooled by the elements when current is applied to the device. All four elements also have tapered ends toward the central island 510, as discussed previously. The n-type and p-type thermoelectric elements connect to conductors at their other (outer) ends. These conductors serve as hot end heat sinks in the cooling apparatus. During operation, the conductors to which the n-type element are connected are held at a higher potential than the conductor to which the p-type elements are connected. This causes current to flow from the outside of the n-type elements toward the central island, and from the central island through the p-type elements to the outer conductors. The direction of proper current flow for this embodiment is shown in the figure. This configuration causes the central island to cool.

The dimensions of such a cooling cell is on the order of 10 microns. Because of the small dimensions of the central element, a very small area can be spot cooled. The spots may be parts of integrated circuits, such as low noise transistors, or can be replicated in arrays for image sensors or the like.

Figure 5B:
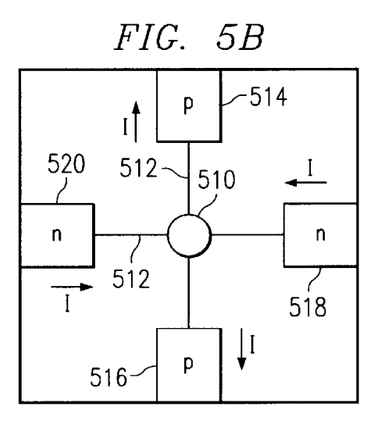
FIG. 5B shows a two-dimensional unit cooling cell consistent with a preferred embodiment using nanowires.

FIG. 5B shows a two-dimensional thermoelectric cooling cell consistent with an embodiment of the innovative system. The two-dimensional unit cooling cell comprises two p-type thermoelectric elements 514, 516, and two n-type thermoelectric elements 518, 520. All four elements connect to a central island 510, which due to the Peltier effect is cooled when current is applied to the device. Instead of tapered ends on the thermoelectric elements, these elements are connected to the central island via nanowires. If the nanowire si composed of thermoelectric material, the cooling phenomenon occurs at the junction with the island. On the other hand, if carbon nanotubes are used, the cooling occurs at the thermoelectric elements 514–520, but the cooling effect is conveyed to the islands by the higher thermal conductivity of the carbon nanotube.

Figure 6A:
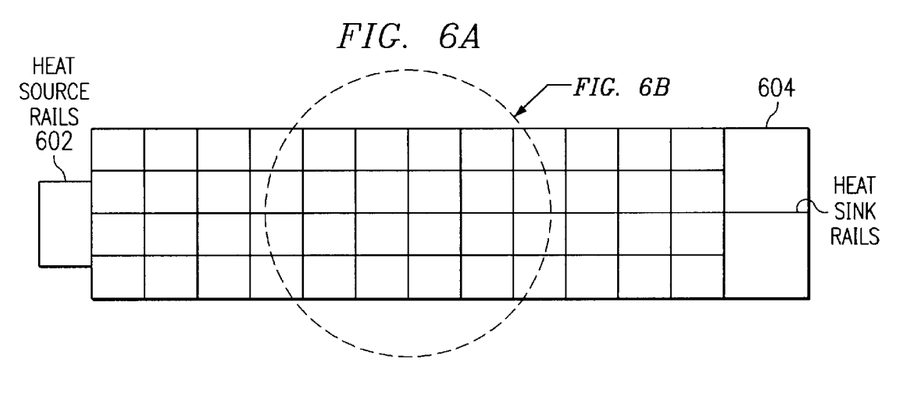
FIG. 6A shows an array of one-dimensional thermoelectric cooling devices consistent with a preferred embodiment.
Figure 6B:
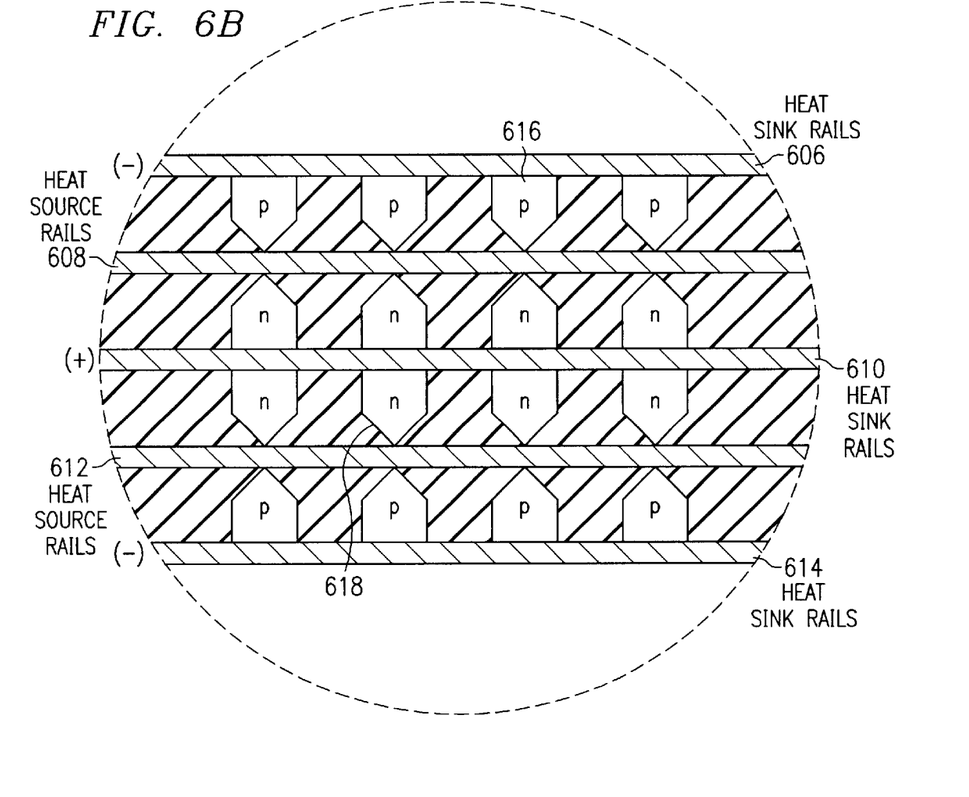
FIG. 6B shows a detail of FIG. 6A.

FIGS. 6A and 6B are a block diagram and shows a view of an array of one-dimensional cooling cells arranged in a rectangular pattern. In this example, the array has two sets of thermoelectric cooling systems positioned with a common conducting rail 610 between them. In this particular configuration, there are three "hot" rails 606, 610, 614 which absorb heat, and two "cold" rails 608, 612 which cool during operation of the thermoelectric cooling system.

Such a cascading array of cooling elements is useful in one sense because the total amount of heat removed by each individual thermoelectric element may be small. By linking several cooling elements together in an array, the benefit of multiple elements can be obtained in a relatively small area. In the example configuration of FIG. 6A, the left end 602 of the array is used as a cooling device while the hot end 604 dissipates heat to a heat ground or other use.

FIG. 6B shows a detail view of part of FIG. 6A. In this view, outer rails 606, 614 and center rail 610 absorb heat from the thermoelectric cooling devices. Cold rails 608, 612 are cooled by the action of the thermoelectric elements.

This array of coolers comprises two rows of coolers with the common heat sink rail 610 between them. The center rail 610 in this example is held at a high potential, whole the outer rails 606, 614 are held at a relatively low potential. This causes current to flow from rail 610 through n-type thermoelectric elements, through either 608 or 612 respectively, then through p-type thermoelectric elements on the outer rows of the array (for example, p-type thermoelectric elements 616). As described above, this causes the cold rails 608, 612 to cool.

Figure 7:
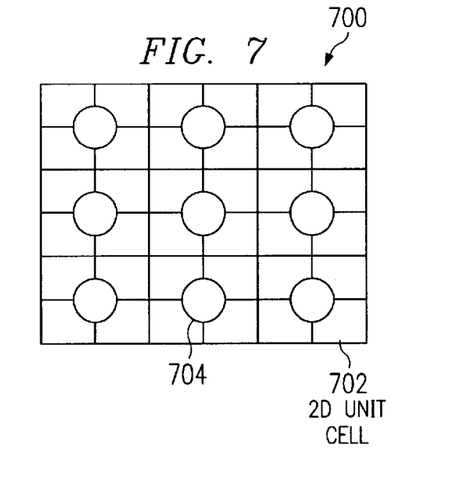
FIG. 7 shows an array of two-dimensional unit cooling cells.

FIG. 7 shows an array 700 of two-dimensional cooling cells arranged into a square. In this example embodiment, several of the two-dimensional cooling units 702 of FIG. 5A or 5B are fabricated into an array of cooling units. In the center of each of the unit cells 702 is shown a cold island 704. Arrays of this type are useful to cool small areas or a system of small areas on, for example, an integrated circuit or an image sensor array. The small size of the coolers allows them to be placed at precise points to cool only a desired area, saving area on the chip.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A thermoelectric cooling system, comprising:
   first and second thermoelectric elements formed over a substrate, the first and second thermoelectric elements each connected to a first conducting section;
   a second conducting section connected to the first thermoelectric element;
   a third conducting section connected to the second thermoelectric element;
   wherein the first thermoelectric element has a smaller surface contact area with the first conducting section than it has with the second conducting section;
   wherein the second thermoelectric element has a smaller surface contact area with the first conducting section than it has with the third conducting section; and
   wherein the first and second thermoelectric elements are formed in substantially the same plane as the first, second, and third conducting sections occupy.

2. The cooling system of claim 1, wherein the thermoelectric cooling system is disposed on an integrated circuit to cool a region of the circuit.

3. The cooling system of claim 1, wherein the thermoelectric cooling system forms a cooling unit, and wherein a plurality of cooling units are configured to collectively cool a region.

4. A thermoelectric cooling system, comprising:
   an n-type thermoelectric element and a p-type thermoelectric element each coupled to a first conducting section;
   a second conducting section connected to the n-type element;
   a third conducting section connected to the p-type element;
   wherein the n-type element, the p-type element, and the first, second, and third conducting sections substantially occupy the same plane.

5. The thermoelectric cooling system of claim 4, wherein the thermoelectric cooling system is disposed on an integrated circuit to cool a region of the circuit.

6. The thermoelectric cooling system of claim 4, wherein the thermoelectric cooling system forms a cooling unit, and wherein a plurality of cooling units are configured to collectively cool a region.

7. The thermoelectric cooling system of claim 4, further comprising third and fourth thermoelectric elements each coupled to the first conducting section, wherein the n-type thermoelectric element, the p-type thermoelectric element, the third and fourth thermoelectric elements, and the first conducting section are all coplanar.

8. The thermoelectric cooling system of claim 4, wherein the n-type and p-type thermoelectric elements are substantially tapered to points where they couple to the first conducting section.

9. The thermoelectric cooling system of claim 4, wherein the n-type and p-type thermoelectric elements couple to the first conducting section using nanowires.

10. The thermoelectric cooling system of claim 4, wherein the first conducting section comprises a first central island, and wherein the thermoelectric cooling system comprises a plurality of central islands, each of the central islands of the plurality having at least two thermoelectric elements connected thereto.

11. A thermoelectric cooling system, comprising:
    a plurality of thermoelectric elements, each element of the plurality having a connection to a common conducting section;
    wherein the plurality of elements and the common conducting section substantially occupy the same plane.

12. The thermoelectric cooling system of claim 11, wherein each of the thermoelectric elements of the plurality has a narrowed end where it contacts the common conducting section.

13. The thermoelectric cooling system of claim 11, wherein the thermoelectric cooling system is disposed on an integrated circuit to cool a region of the circuit.

14. The thermoelectric cooling system of claim 11, wherein the thermoelectric cooling system forms a cooling unit, and wherein a plurality of cooling units are configured to collectively cool a region.

15. A method of forming a thermoelectric cooling system, comprising the steps of:
    forming a substrate, the substrate having an insulating layer thereon;
    forming a conducting layer above the insulating layer to form a multi-layer structure;
    in a first region, removing a first part of the multi-layer structure from the substrate such that the first region is bounded by a first section of the multi-layer structure and a second section of the multi-layer structure;
    in a second region, removing a second part of the multi-layer structure from the substrate such that the second region is bounded by the second section of the multi-layer structure and a third section of the multi-layer structure;
    forming between the conducting layer of the first section of the multi-layer structure and the conducting layer of the second section of the multi-layer structure a first thermoelectric element;
    forming between the conducting layer of the second section of the multi-layer structure and the conducting layer of the third section of the multi-layer structure a second thermoelectric element.

16. The method of claim 15, wherein the first thermoelectric element has a smaller area of contact with the second conducting layer of the second section of the multi-layer structure than it does with the conducting layer of the first section of the multi-layer structure; and wherein the second thermoelectric element has a smaller area of contact with the second conducting layer of the second section of the multi-layer structure than it does with the conducting layer of the third section of the multi-layer structure.

17. The method of claim 15, wherein the steps of forming the first and second thermoelectric elements include electroplating.

18. The method of claim 15, wherein the thermoelectric cooling system is disposed on an integrated circuit to cool a region of the circuit.

19. The method of claim 15, wherein the thermoelectric cooling system forms a cooling unit, and wherein a plurality of cooling units are configured to collectively cool a region.

20. A thermoelectric cooling system, comprising:

means for forming a substrate, the substrate having an insulating layer thereon;

means for forming a conducting layer above the insulating layer to form a multi-layer structure;

in a first region, means for removing a first part of the multi-layer structure from the substrate such that the first region is bounded by a first section of the multi-layer structure and a second section of the multi-layer structure;

in a second region, means for removing a second part of the multi-layer structure from the substrate such that the second region is bounded by the second section of the multi-layer structure and a third section of the multi-layer structure;

means for forming between the conducting layer of the first section of the multi-layer structure and the conducting layer of the second section of the multi-layer structure a first thermoelectric element;

means for forming between the conducting layer of the second section of the multi-layer structure and the conducting layer of the third section of the multi-layer structure a second thermoelectric element.

21. The thermoelectric cooling system of claim 20, wherein the first thermoelectric element has a smaller area of contact with the second conducting layer of the second section of the multi-layer structure than it does with the conducting layer of the first section of the multi-layer structure; and wherein the second thermoelectric element has a smaller area of contact with the second conducting layer of the second section of the multi-layer structure than it does with the conducting layer of the third section of the multi-layer structure.

22. The thermoelectric cooling system of claim 20, wherein the cooling system is disposed on an integrated circuit to cool a region of the circuit.

23. The thermoelectric cooling system of claim 20, wherein the thermoelectric cooling system forms a cooling unit, and wherein a plurality of cooling units are configured to collectively cool a region.

24. A thermoelectric cooling system, comprising:

a first row of n-type thermoelectric elements, each connected to a first conducting section;

a first row of p-type thermoelectric elements, each connected to the first conducting section;

a second conducting section connected to each of the n-type elements;

a third conducting section connected to each of the p-type elements;

wherein the first row of n-type elements and the first row of p-type elements form an array of thermoelectric coolers which collectively cool the first conducting section when a current is applied to the cooling system;

wherein the first row of n-type elements and the first row of p-type elements occupy substantially the same plane as the first conducting section.

25. The thermoelectric cooling system of claim 24, wherein at least one of the plurality of n-type elements has a smaller surface contact area with the first conducting section than with the second conducting section; and wherein at least one of the plurality of p-type elements has a smaller surface contact area with the first conducting section than with the third conducting section.

26. The thermoelectric cooling system of claim 24, wherein the thermoelectric cooling system is disposed on an integrated circuit to cool a region of the circuit.

27. The thermoelectric cooling system of claim 24, wherein the thermoelectric cooling system forms a cooling unit, and wherein a plurality of cooling units are configured to collectively cool a region.

* * * * *

UNITED STATES PATENT AND TRADEMARK OFFICE
CERTIFICATE OF CORRECTION

PATENT NO. : 6,598,403 B1
DATED : July 29, 2003
INVENTOR(S) : Ghoshal

It is certified that error appears in the above-identified patent and that said Letters Patent is hereby corrected as shown below:

<u>Column 8,</u>
Line 17, delete "wherein-the" and insert -- wherein the --.

Signed and Sealed this

Third Day of February, 2004

JON W. DUDAS
*Acting Director of the United States Patent and Trademark Office*